US009908320B2

(12) United States Patent  
Mizukoshi

(10) Patent No.: US 9,908,320 B2
(45) Date of Patent: Mar. 6, 2018

(54) SCREEN PRINTER

(71) Applicant: FUJI MACHINE MFG. CO., LTD., Chiryu (JP)

(72) Inventor: Tsuyoshi Mizukoshi, Chiryu (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 4 days.

(21) Appl. No.: 15/118,953

(22) PCT Filed: Feb. 25, 2014

(86) PCT No.: PCT/JP2014/054448
§ 371 (c)(1),
(2) Date: Aug. 15, 2016

(87) PCT Pub. No.: WO2015/128929
PCT Pub. Date: Sep. 3, 2015

(65) Prior Publication Data
US 2017/0050427 A1    Feb. 23, 2017

(51) Int. Cl.
*B41F 15/44*    (2006.01)
*H05K 3/12*    (2006.01)
*B41F 15/08*    (2006.01)
*B41F 15/42*    (2006.01)
*H05K 3/34*    (2006.01)

(52) U.S. Cl.
CPC .......... *B41F 15/44* (2013.01); *B41F 15/0881* (2013.01); *B41F 15/423* (2013.01); *H05K 3/1233* (2013.01); *B41P 2215/132* (2013.01); *H05K 3/3484* (2013.01)

(58) Field of Classification Search
CPC ........ B41F 15/42; B41F 15/423; B41F 15/44; B41F 15/46; B41F 15/0881; H05K 3/1233; H05K 3/3484
USPC ......................................................... 101/123
See application file for complete search history.

(56) References Cited

U.S. PATENT DOCUMENTS 5,893,325 A *  4/1999  Sakai .................... B41F 15/423
                                                                101/123
5,996,487 A * 12/1999  Tomomatsu ............ B41F 15/42
                                                                101/123
6,112,656 A    9/2000  Asai et al.
2011/0283512 A1* 11/2011 Doyle ................. B41F 15/0881
                                                                29/428

FOREIGN PATENT DOCUMENTS

JP    11-227157 A    8/1999

OTHER PUBLICATIONS

International Search Report dated Jun. 10, 2014 for PCT/JP2014/054448 filed Feb. 25, 2014.

* cited by examiner

*Primary Examiner* — Leslie J Evanisko
(74) *Attorney, Agent, or Firm* — Oblon, McClelland, Maier & Neustadt, L.L.P.

(57) ABSTRACT

A screen printer in which a squeegee is lowered towards a screen when the internal pressure of a second air chamber of a pressing force adjusting air cylinder is decreased. A control section performs control of an air regulator based on response times from starting control of the air regulator to decrease or increase the internal pressure of the second air chamber until a value detected by a pressure sensor reaches a target value of the internal pressure.

5 Claims, 7 Drawing Sheets

SCREEN PRINTER

TECHNICAL FIELD

The present application relates to a screen printer that presses a squeegee against a screen and a device that controls the pressing force of the squeegee.

BACKGROUND ART

Screen printers that print solder paste onto a printed circuit board are known (for example, patent literature 1). With this type of screen printer, with a squeegee contacting a screen provided with multiple holes, the screen and the squeegee are moved relatively such that solder paste on the screen is printed onto a circuit board through the holes. Here, the pressing force of the squeegee on the screen affects printing quality.

Specifically, for example, if the pressing force is insufficient, solder paste will be printed in a state raised from the squeegee side openings of the holes provided in the screen, leading to cases in which adjacent solder paste deposits are undesirably connected to each other. To counter this problem, with the screen printer disclosed in patent literature 1, a compression coil spring that biases the squeegee towards the screen is provided between the squeegee and a frame that holds the squeegee, such that printing is not performed with the solder paste raised.

Conversely, if the pressing force is too great, the squeegee slices solder paste entered inside the holes, which may lead to problems such as insufficient printing quantity or lowered longevity of the squeegee or screen. For this problem, the screen printer disclosed in patent literature 1 is provided with a load sensor for detecting the load applied to the squeegee. As a load applied to the squeegee, in addition to the total weight of a member that moves together with the squeegee when the squeegee approaches and separates from the screen, there is the biasing force of the compression coil spring. The screen printer is provided with an air cylinder that acts on the squeegee with a force in a direction against the biasing force of the compression coil spring, with the pressing force being adjusted by controlling the air cylinder pressure based on an output value of a load sensor.

CITATION LIST

Patent Literature

Patent literature 1: JP-A-Heisei 11-227157

SUMMARY

However, with the above screen printer, a dedicated sensor or the like for detecting the pressing force of the squeegee on the screen is required. Also, in order to accurately detect the load applied on the squeegee, the load sensor must be provided at a position appropriate for the total weight of the member that moves together with the squeegee and the biasing force of the compression coil spring, without being affected by operation that moves the squeegee. Thus, with the above screen printer, in order to provide a dedicated sensor, the configuration of the frame that holds the squeegee and the like is made complex, and manufacturing costs are increased.

The present disclosure takes account of the above problems and an object thereof is to provide a screen printer that allows the pressing force of a squeegee on a screen to be adjusted accurately while having a simple configuration, and that reduces manufacturing costs of the screen printer.

A screen printer disclosed herein takes account of the above problems, and comprises: a screen including multiple holes; a squeegee that slides on the screen so as to print printing material onto a target object through the holes of the screen; a fluid pressure cylinder that biases the squeegee in a direction either towards or away from the screen based on internal pressure of a cylinder housing; a pressure sensor that detects the internal pressure of the cylinder housing; and a control section that controls the internal pressure based on a response time, which is a time from starting control to change the internal pressure by supplying or removing a specified amount of fluid per unit of time with respect to the fluid pressure cylinder to a detection value of the pressure sensor reaching a target value.

Advantageous Effects

A screen printer according to technology disclosed herein allows the pressing force of a squeegee on a screen to be adjusted accurately while having a simple configuration, and reduces manufacturing costs of the screen printer.

DESCRIPTION OF EMBODIMENTS

Figure 1:
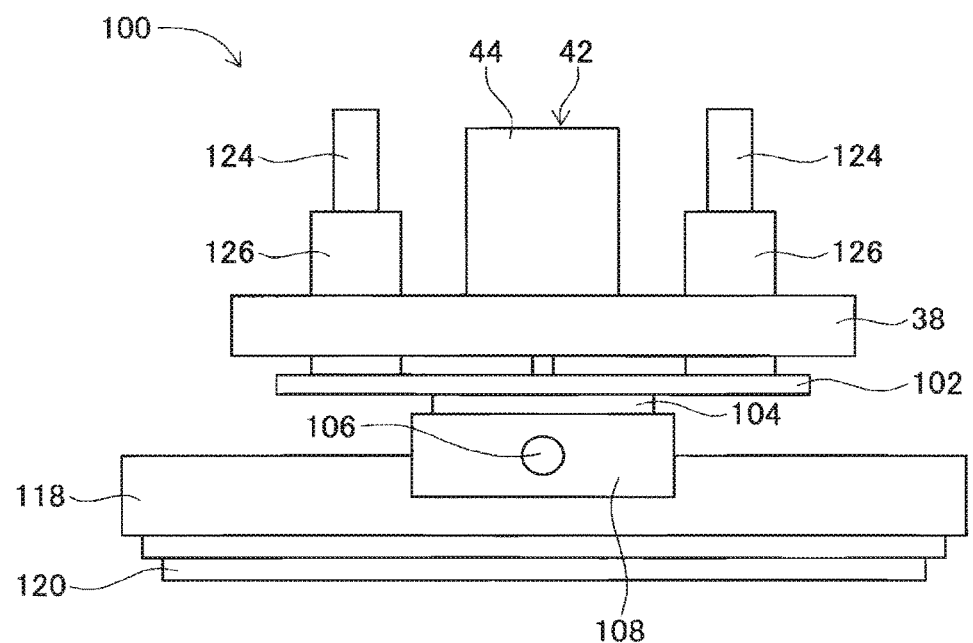
FIG. 1 is a front view of an embodiment of the solder paste printer.

Hereinafter, an embodiment of the present disclosure is described with reference to the figures. FIG. 1 is a front view of an embodiment, solder paste printer 100. As shown in FIG. 1, solder paste printer 100 (also referred to as "printer") is a device that prints solder paste (not shown) on screen 10 (refer to FIG. 2) onto printed circuit board 20 using squeegee 120. In the descriptions below, as shown in FIG. 1, the direction in which squeegee 120 moves is referred to as the Y-axis direction (the left-right direction in FIG. 2), and the direction perpendicular to the Y-axis direction in a horizontal plane of screen 10 is referred to as the X-axis direction (the direction coming straight out of the page in FIG. 2).

Figure 2:
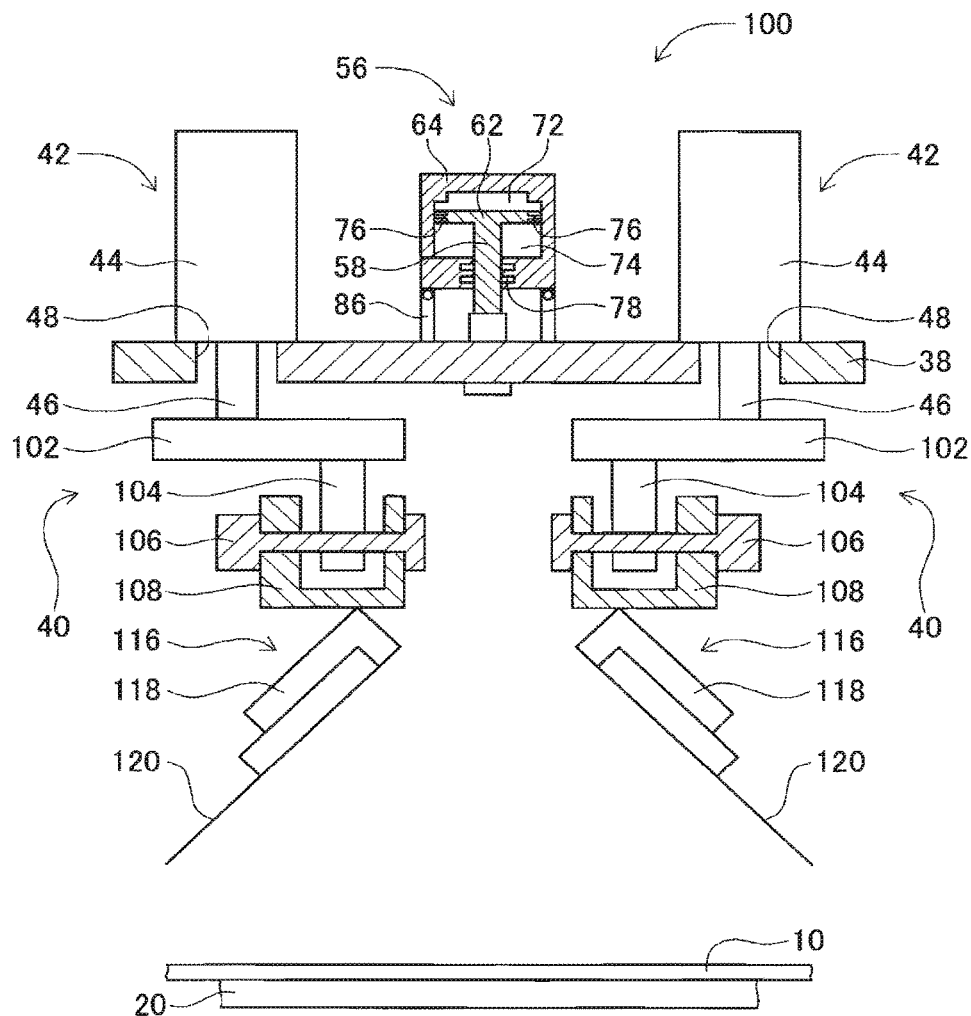
FIG. 2 is a side view of the solder paste printer.
Figure 2:

FIG. 2 is a side view of printer 100. Screen 10 shown in FIG. 2 is provided with multiple holes (not shown) that pierce screen 10 in the thickness direction (the up/down direction in FIG. 2), and the circumferential edges of screen 10 are fixed to a screen frame, which is not shown. The screen frame is loaded on a screen support table the position of which is fixed, and is fixed to the screen support table by a fixing device after being positioned in the X-axis direction and Y-axis direction by a positioning device. Printer 100, after conveying printed circuit board 20 in the X-axis direction under screen 10 using a board conveyor, raises/lowers printed circuit board 20 using a raising/lowering device such that printed circuit board 20 contacts screen 10, or is separated from screen 10. Printed circuit board 20 is made to be in contact with the lower surface of screen 10 during solder paste printing. After solder paste printing, printed circuit board 20 is unloaded by the board conveyor. Note that, for convenience of understanding, screen 10 and printed circuit board 20 are shown closer to squeegee 120 in FIG. 2 than they are in actuality.

Printer 100 includes a squeegee moving device, which is not shown. The squeegee moving device includes a Y-axis slide, not shown, that is held to be movable in the Y-axis direction, and the Y-axis slide is moved in the Y-axis direction by servo motor 34 (refer to FIG. 4) being driven. Frame 38 is provided on the Y-axis slide. Two sets of squeegee units 40 (refer to FIG. 2) are provided on frame 38. Frame 38 is moved in the Y-axis direction together with the Y-axis slide by a squeegee moving device. The two sets of squeegee units 40 are provided at symmetrical positions in the Y-axis direction and have the same configuration. One of the squeegee units 40 is described below as a representative example.

As shown in FIG. 2, squeegee raising/lowering air cylinder 42 is provided on frame 38 facing downwards. Cylinder housing 44 of squeegee raising/lowering air cylinder 42 is fixed with respect to frame 38. Piston rod 46 of squeegee raising/lowering air cylinder 42 protrudes downwards from cylinder housing 44 and is inserted into through-hole 48 formed in frame 38.

Pressing force adjustment air cylinder 56 is provided between each of cylinder housings 44 of the two sets of squeegee units 40 in the Y-axis direction. With cylinder housing 64 of pressing force adjustment air cylinder 56, first air chamber 72 is formed on an upper side of piston 62, and second air chamber 74 is provided on a lower side of piston 62. Piston rod 58 of piston 62 protrudes downwards from inside cylinder housing 64, with a tip section thereof fixed to frame 38.

No seal member is provided at the section at which piston 62 and cylinder housing 64 slide by each other; instead, the clearance between piston 62 and cylinder housing 64 is smaller than usual, such that a practically sealed state is achieved. Two toric clearance grooves 76 are formed in the outer circumferential surface of piston 62. Also, two toric clearance grooves 78 are formed in the through-hole of cylinder housing 64 through which piston rod 58 is inserted. Accordingly, piston 62 slides smoothly even though the clearance with cylinder housing 64 is small. Also, compression coil spring 86 is provided between frame 38 and cylinder housing 64 in a vertical direction, such that frame 38 is biased downwards.

An end of piston rod 46 of squeegee raising/lowering air cylinder 42 inserted into through-hole 48 provided in frame 38 is connected to support member 102. Straight line moving member 104 is fixed to a lower surface of support member 102. Support shaft 106 is held by straight line moving member 104. Swing member 108 is swingably held at the center of support shaft 106 by support shaft 106 in the Y-axis direction. Squeegee holding member 118 of print head 116 is attached to a lower surface of swing member 108. With print head 116, squeegee 120 is attached to squeegee holding member 118. Print head 116 is swingable together with swing member 108, and raisable by squeegee raising/lowering air cylinder 42 and pressing force adjustment air cylinder 56.

As shown in FIG. 1, a pair of straight guide rods 124 are provided on an upper surface of straight line moving member 104 separated in the X-axis direction. Guide rods 124 are slidably engaged in the axis direction with two guidance tubes 126 provided vertically on frame 38, and guide straight line moving member 104, swing member 108, and squeegee 120 in the raising/lowering direction.

Squeegee holding member 118 is a substantially rectangular plate, with the direction perpendicular to the main surface arranged to be the Y-axis direction, and squeegee 120 attached so as to be detachable. Squeegee 120, for example, made from rubber or metal (for example, stainless steel), is a substantially rectangular plate, and is held by squeegee holding member 118 so that the main surface faces the Y-axis direction. Squeegee 120 is held by squeegee holding member 118 in a state tilted with respect to the horizontal surface of screen 10 (refer to FIG. 2).

Adjusting the Pressing Force of Squeegee 120 on Screen 10

Figure 3:
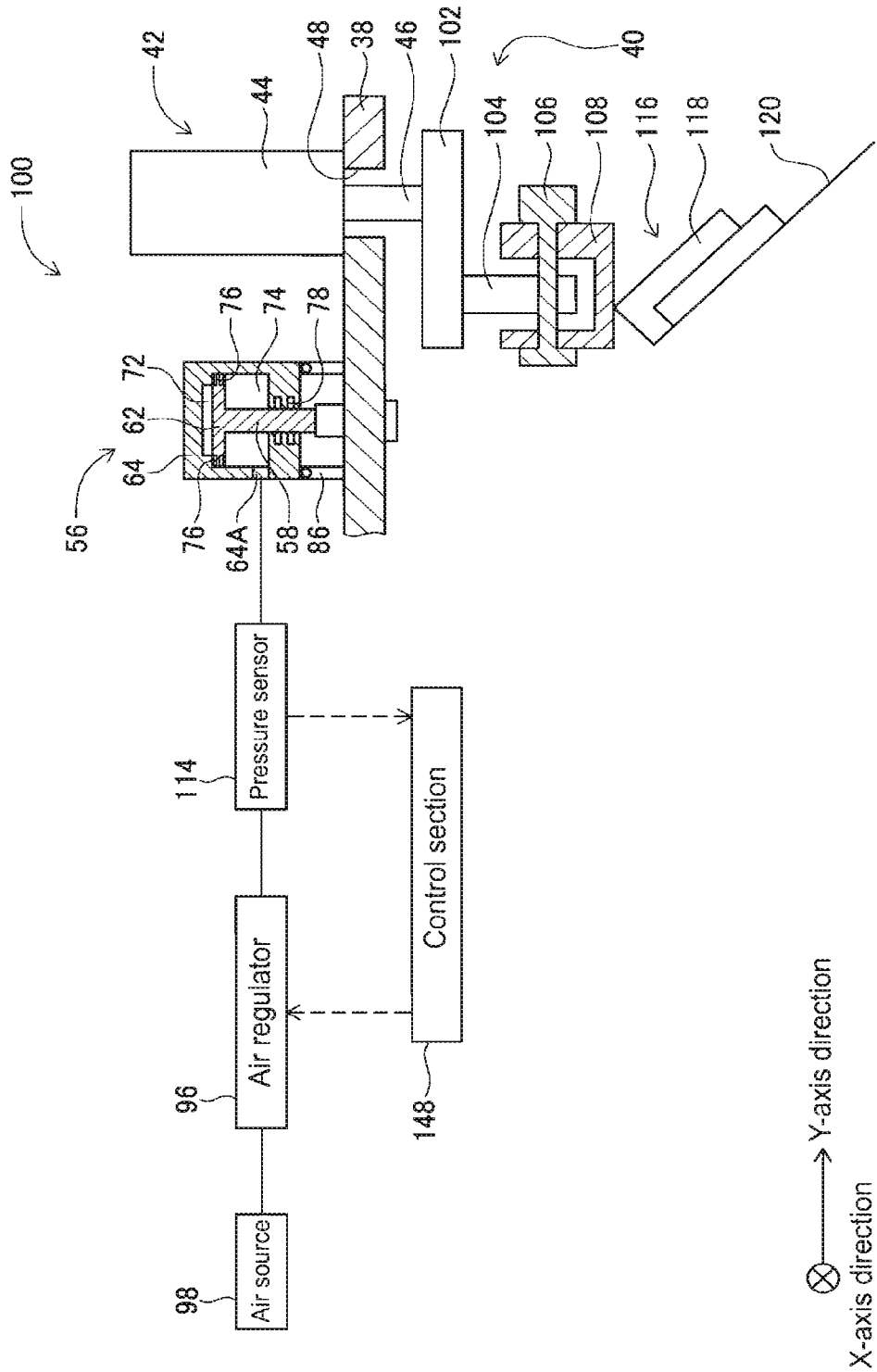
FIG. 3 is a conceptual view showing the configuration for supplying air to the air cylinder used for adjusting the pressing force of the solder paste printer.

As shown in FIG. 3, air is supplied to second air chamber 74 of cylinder housing 64 from air regulator 96 via opening 64A of cylinder housing 64. Piston 62 of cylinder housing 64 is raised/lowered based on the internal pressure of second air chamber 74. Air regulator 96 is connected between air source 98 and second air chamber 74. Air regulator 96 supplies air of a predetermined pressure value supplied from air source 98 to second air chamber 74 after adjusting the pressure based on control of control section 148. The internal pressure of second air chamber 74 changes as air is supplied or removed based on the pressure of air supplied from air regulator 96. Also, pressure sensor 114 that detects the internal pressure of second air chamber 74 is provided between air regulator 96 and cylinder housing 64. Pressure sensor 114 outputs a detection result to control section 148. Note that, FIG. 3 shows a state in which printing is not being performed, with items raised to an upper end position. Control section 148, for example, controls air regulator 96 such that air with a pressure higher than atmospheric pressure is supplied to second air chamber 74, thereby raising squeegee 120 to the upper end position of FIG. 3.

Figure 4:
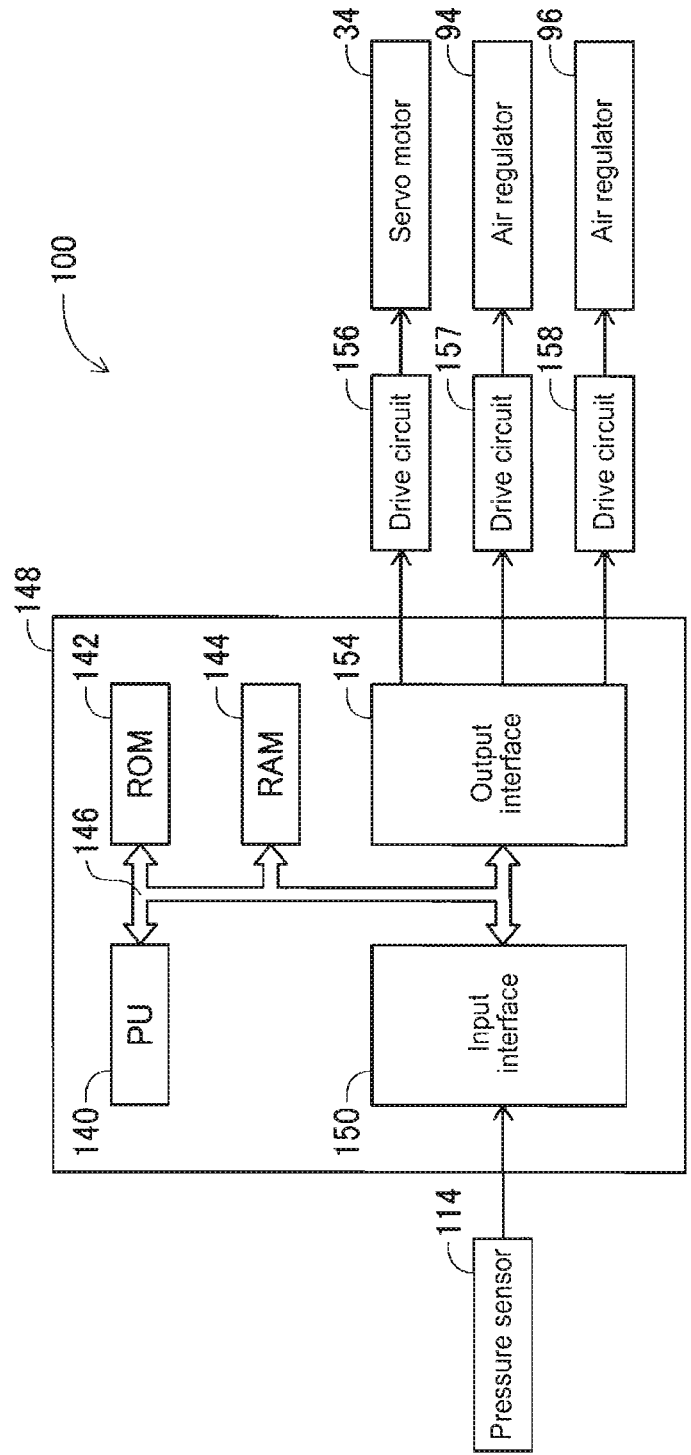
FIG. 4 is a block diagram showing the control section that controls the solder paste printer.

As shown in FIG. 4, control section 148 includes processing circuit PU 140, ROM 142 on which a control program and the like is memorized, working memory RAM 144, with these items being connected by bus 146. Input interface 150 is connected to bus 146, and is used to enter the internal pressure value of second air chamber 74 detected by pressure sensor 114. Also, multiple drive circuits, drive circuits 156 to 158, are connected to bus 146 via output interface 154. Control section 148 controls servo motor 34 via drive circuit 156. Also, control section 148 controls air regulator 94 that adjusts the pressure of air supplied to each squeegee raising/lowering cylinder 42 via drive circuit 157. Further, control section 148 controls air regulator 96 via drive circuit 158.

Next, printing operation of printer 100 is described. With the present embodiment of printer 100, printing is performed alternately by two sets of squeegee units 40. Control section 148 controls a squeegee moving device (servo motor 34) such that the two sets of squeegee units 40 are moved in the Y-axis direction from one side to the other. When moving squeegee unit 40, control section 148 lowers squeegee 120 of the squeegee unit 40 positioned at the upstream side in the moving direction such that squeegee 120 contacts screen 10 with the desired pressing force. Squeegee unit 40 is moved along screen 10 and as solder paste loaded on screen 10 is scraped by squeegee 120, solder paste is printed onto printed circuit board 20 via the holes provided in screen 10. Here, for the squeegee unit positioned at the downstream side, piston rod 46 of squeegee raising/lowering air cylinder 42 and cylinder housing 64 of pressing force adjustment air cylinder 56 are moved to the upper end position, such that squeegee 120 does not contact screen 10. When printer 100 completes printing, printed circuit board 20 for which printing has been completed is unloaded and the next printed circuit board 20 is loaded. Further, printer 100, as well as raising the squeegee 120 that was just used for printing, lowers the squeegee 120 that was not just used for printing such that their respective positions are switched, and then performs printing by moving squeegee unit 40 the opposite direction in the Y direction.

Figure 5:
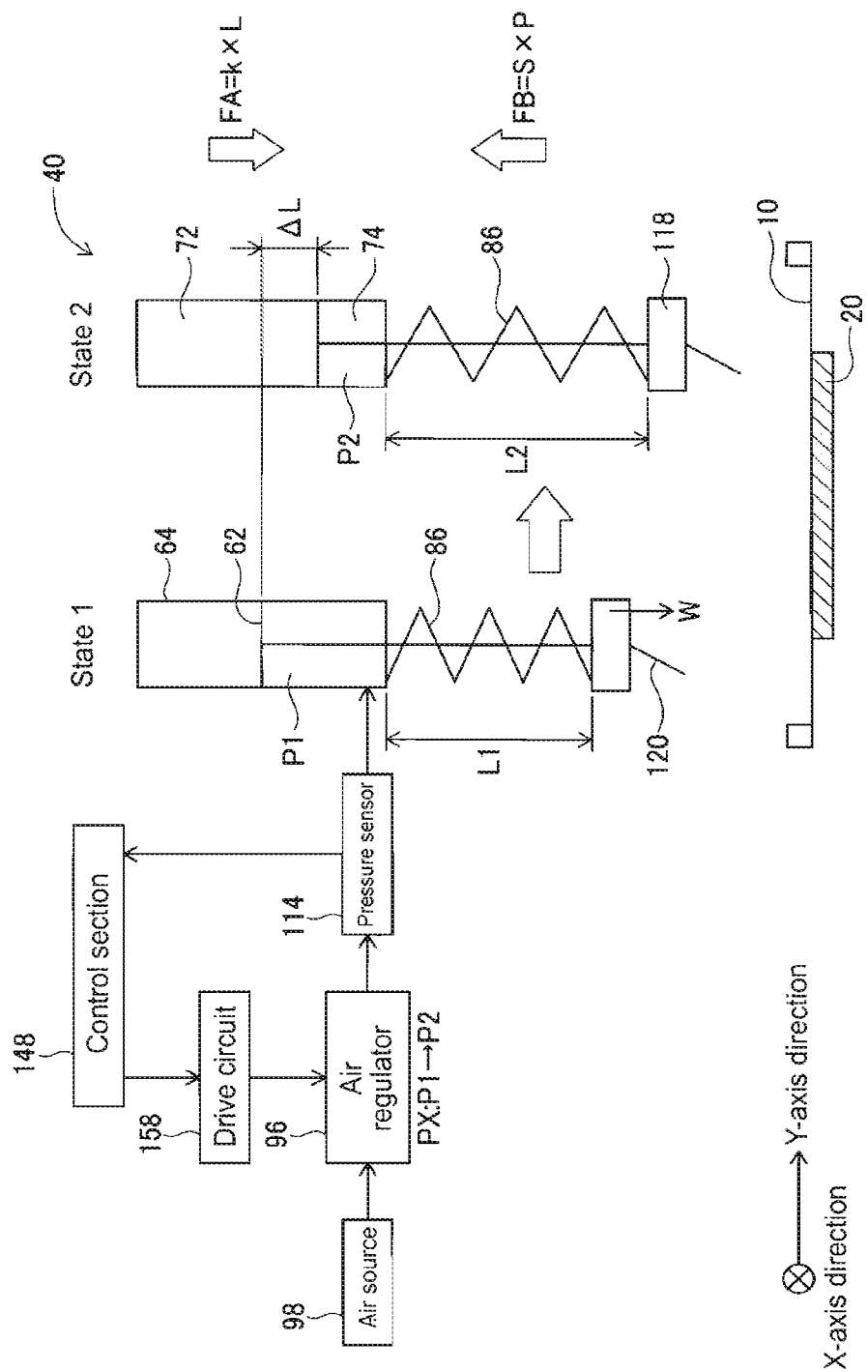
FIG. 5 is a conceptual view showing the state before the squeegee contacts the screen.

FIG. 5 is a conceptual view showing the state before the squeegee contacts the screen. Note that, as described above, with printer 100 of the present embodiment, of the squeegees 120, while printing is being performed with one of the squeegees 120, the other squeegee 120 is held at a raised end position. Descriptions below are giving largely based on the squeegee unit 40 being used for printing. Control section 148, when lowering squeegee 120, first drives air regulator 94 corresponding to squeegee raising/lowering air cylinder 42 (refer to FIG. 1) via drive circuit 157, thereby lowering squeegee 120. Squeegee raising/lowering air cylinder 42 lowers squeegee 120 to a position slightly above screen 10 (for example, a position 3 mm higher than screen 10).

Next, control section 148 lowers squeegee 120 using pressing force adjusting air cylinder 56. Pressing force adjusting air cylinder 56 makes force from piston rod 58 act on frame 38 against the biasing force of compression coil spring 86. The force that pressing force adjusting air cylinder 56 applies to frame 38 acts on squeegee 120 via squeegee raising/lowering air cylinder 42, straight line moving member 104, squeegee holding member 118, and the like. The force that pressing force adjusting air cylinder 56 applies to frame 38 is smaller the smaller the internal pressure of second air chamber 74. Here, force FC of the following equation acts on squeegee 120.

$$FC=FA+W-FB \quad (1)$$

In the above equation, FA is the biasing force in the downward direction due to compression coil spring 86. W is the total weight of each member raised/lowered by pressing force adjusting air cylinder 56 (frame 38, squeegee raising/lowering air cylinder 42, support member 102, straight line moving member 104, swing member 108, support shaft 106, squeegee holding member 118, and squeegee 120). FB is the upwards force that pressing force adjusting air cylinder 56 applies to squeegee 120 against the biasing force of compression coil spring 86.

Control section 148 controls regulator 96 to decrease the internal pressure of second air chamber 74. FB decreases as the pressure of second air chamber 74 lowers, thus squeegee 120 is lowered by force FA of compression coil spring 86. Squeegee 120 stops when the upward and downward forces are equal (when force FC is zero). Control section 148 sets the time from starting the instruction of decreasing the pressure to air regulator 96 until a value detected by pressure sensor 114 reaches a target value as "response time", and the state of squeegee 120 contacting screen 10 or squeegee 120 separating from screen 10 is detected based on the response time.

In detail, force FA of equation (1) above is represented by the following equation.

$$FA=k \times L \quad (2)$$

In equation (2), k is the spring constant of compression coil spring 86. L is the length in the vertical direction of compression coil spring 86. Further, force FB of equation (1) above is represented by the following equation.

$$FB=S \times P \quad (3)$$

In equation (3), S is the cross section area of cylinder housing 64 (the surface ara when looking at piston 62 inside cylinder housing 64 from one direction of the upward and the downward directions). P is the internal pressure of second air chamber 74.

For example, consider that air regulator 96 controls pressure PX to decrease from P1 to P2. Then, as shown in FIG. 5, the state changes from state 1 to state 2, with length L of compression coil spring 86 changing from L1 to L2, and the internal pressure P of second air chamber 74 changing from P1 to P2. In this case, if the conditions of state 1 and state 2 are each put into equations (1) to (3), we get the following equations.

$$FC=k \times L1+W-S \times P1 \quad (4)$$

$$FC=k \times L2+W-S \times P2 \quad (5)$$

In a case in which squeegee 120 stops at a position at which the forces are equal in a state not contacting screen 10, force FC becomes zero, so the change in the length L of compression coil spring 86, $\Delta L$, is represented by the following equation from equations (4) and (5) above.

$$\Delta L=L2-L1=(P2-P1)S/k \quad (6)$$

Also, in the above state 1 and state 2, the volume of second air chamber 74 is decreased by the amount that piston 62 lowered. The change in the volume of second air chamber 74, $\Delta V1$, is represented by the following equation using equation (6) above.

$$\Delta V1=S \times \Delta L=S2(P2-P1)/k \quad (7)$$

Thus, for cylinder housing 64, during the time that the internal pressure changes from P1 to P2 by air regulator 96 and until the lowering of squeegee 120 stops, air corresponding to change amount $\Delta V1$ is removed from second air chamber 74.

Also, opening 64A (refer to FIG. 3) of a predetermined size connected to air regulator 96 and second air chamber 74 is formed in cylinder housing 64. Therefore, a specified flow of air per unit of time is supplied to or removed from second air chamber 74 via opening 64A corresponding to the change in internal pressure P. If Q is taken as the flow per unit of time of air through opening 64A, response time RT1 from when control section 148 instructs air regulator 96 to decrease the pressure from pressure P1 to pressure P2 until a value detected by pressure sensor 114 reaches a target value (pressure P2) is represented by the following equation using equation (7) above.

$$RT1=\Delta V1/Q=\{S2(P2-P1)/k\}/Q \quad (8)$$

Figure 6:
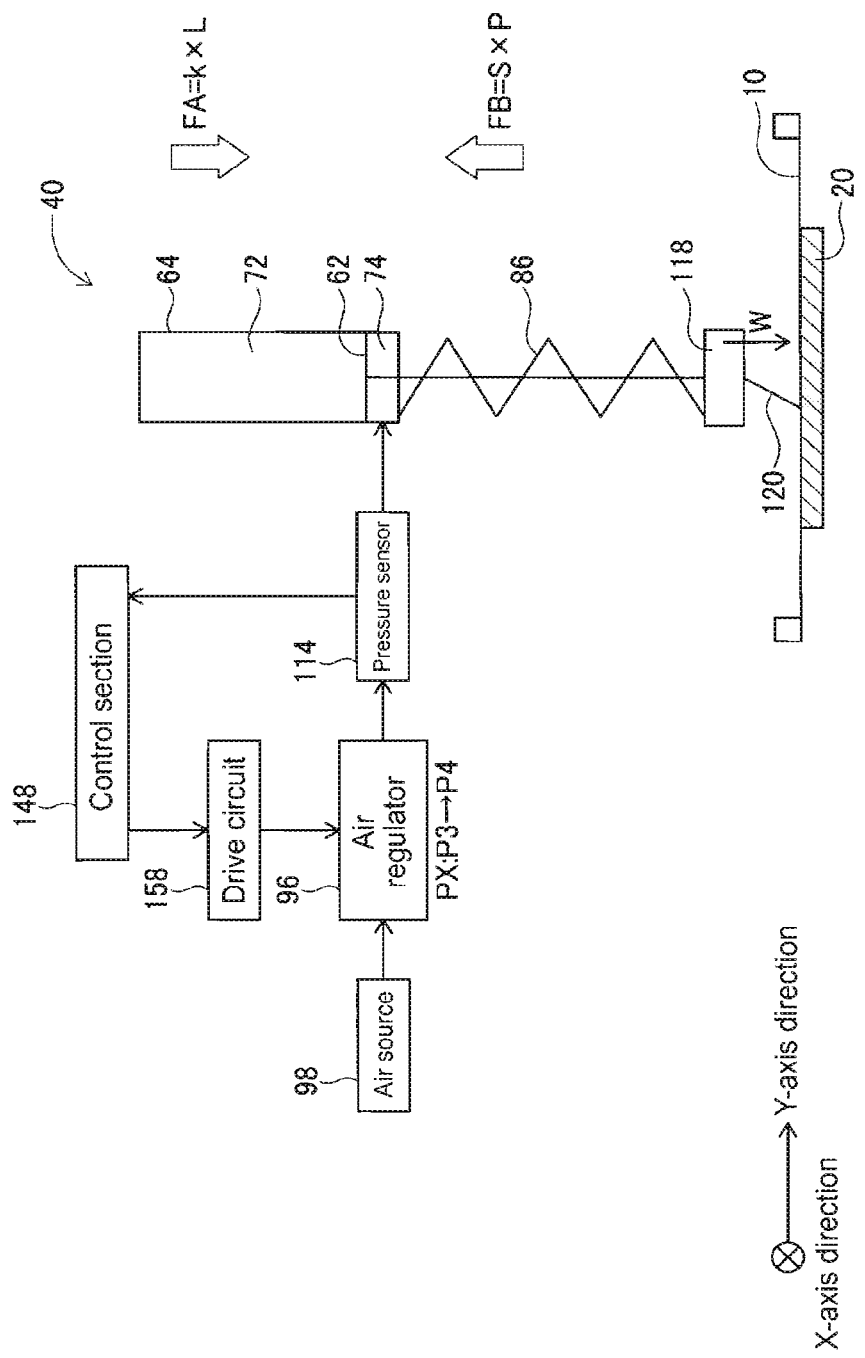
FIG. 6 is a conceptual view showing the state after the squeegee has contacted the screen.

Conversely, as shown in FIG. 6, after squeegee 120 contacts screen 10, the position of squeegee 120 does not change. Therefore, if, for example, air regulator 96 changes internal pressure P from pressure P3 to pressure P4, the pressure changes while the volume of second air chamber 74 remains the same. That is, the change state of second air chamber 74 is different before and after squeegee 120 contacts screen 10. For cylinder housing 64, while the internal pressure is being changed from pressure P3 to pressure P4 by air regulator 96, air corresponding to change amount $\Delta V2$ represented by the following equation is removed from second air chamber 74.

$$\Delta V2=V3-(P3/P4)V3=V3 \times (P4-P3)/P4 \quad (9)$$

In the above equation, V3 is the volume of second air chamber 74 in a state with squeegee 120 contacting screen 10.

Also, in this case, response time RT2 from when control section 148 instructs air regulator 96 to decrease the pressure from pressure P3 to pressure P4 until a value detected by pressure sensor 114 reaches a target value (pressure P4) is represented by the following equation using equation (9) above.

$$RT2 = \Delta V2/Q = \{V3 \times (P4-P3)/P4\}/Q \quad (10)$$

Further, squeegee 120 is pressed against screen 10 with force FC (refer to equation (1)) based on the pressure decrease (decrease in force FB) of second air chamber 74.

As above, response time RT1 before squeegee contacts screen 10 is different to response time RT2 after squeegee 120 contacts screen 10. With printer 100 of the present embodiment, change amount ΔV1 is large compared to change amount ΔV2 because the volume of second air chamber 74 changes a lot as the vertical position of cylinder housing 64 (squeegee 120) changes. Therefore, for response times RT1 and RT2 that correspond to change amounts ΔV1 and ΔV2, response time RT2 is fast compared to response time RT1. Following, control section 148 of the present embodiment calculates a response time while internal pressure P of second air chamber 74 decreases, and when detecting that the response time has changed from response time RT1 to response time RT2, determines that squeegee 120 is in a state contacting screen 10. When control section 148 detects contact of squeegee 120 on screen 10, using the set pressure at the point of detection as a reference, control section 148 further controls internal pressure P to change the pressing force of squeegee 120 on screen 10 to a desired degree.

Figure 7:
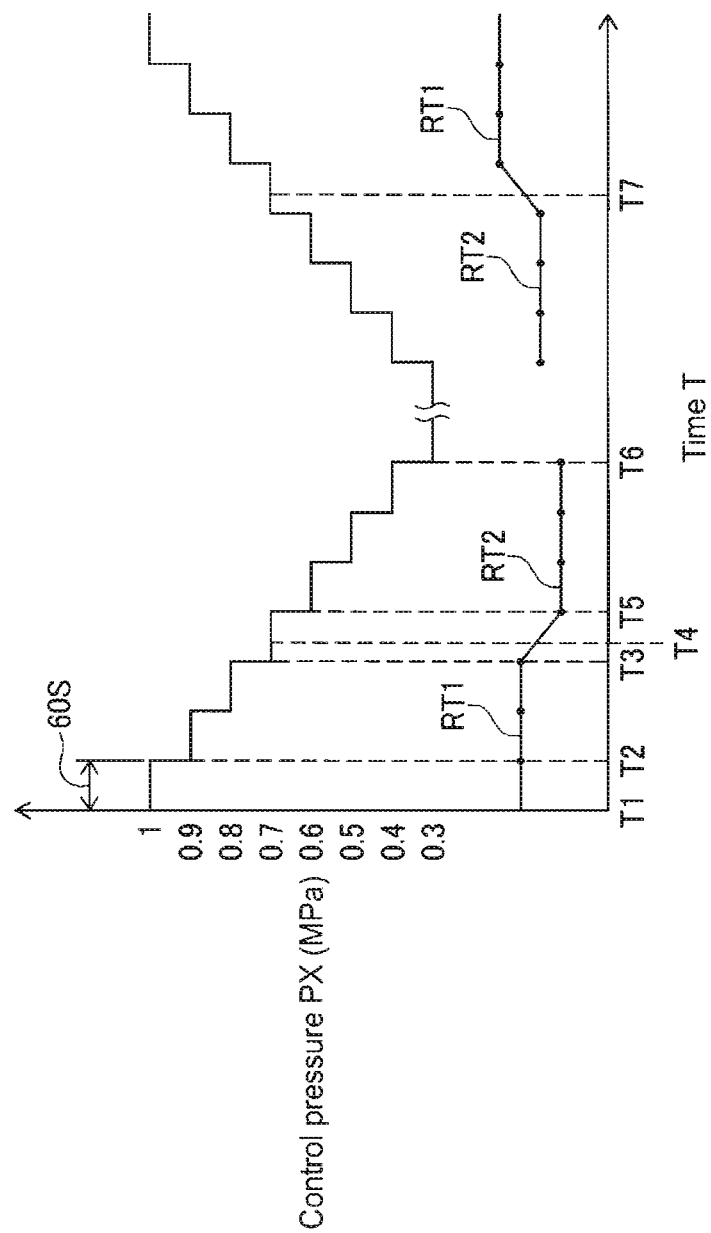
FIG. 7 is a graph showing the relationship between the control pressure of the air regulator and response time.

The graph of FIG. 7 shows the relationships between control pressure PX of air regulator 96 and response times RT1 and RT2. The vertical axis is control pressure PX to which control section 148 controls air regulator 96. The horizontal axis is time. In the example shown in FIG. 7, for example, control to decrease pressure in second air chamber 74 is started from time T1, and squeegee 120 contacts screen 10 at time T4. Further, for second air chamber 74 of housing cylinder 64, in the state at time T1 when pressure decreasing started, internal pressure P is 1 MPa (megapascals). Control section 148, for example, changes control pressure PX for air regulator 96 such that the pressure decreases or increases by 0.1 MPa every 60 seconds (S). Also, control section 148 determines response times RT1 and RT2 every 60 seconds. This control period of 60 seconds is, for example, enough time for air regulator 96 to increase or decrease the pressure of second air chamber 74 by 0.1 MPa, that is, is sufficiently long time compared to response times RT1 and RT2.

First, control section 148, at time T1, starts control to decrease control pressure PX for air regulator 96, that is, to decrease internal pressure P of second air chamber 74 from 1 MPa to 0.9 MPa. At this stage, because the state is before squeegee 120 has contacted screen 10, at the point when only response time RT1 from time T1 has elapsed, the value detected by pressure sensor 114 reaches 0.9 MPa, and that detection result is entered into control section 148. Control section 148 determines the response time at time T2, which is 60 seconds after time T1. Control section 148 determines that the response time is response time RT1. Similarly, control section 148 decreases control pressure PX by 0.1 MPa every 60 seconds.

Subsequently, control section 148 starts control to decrease control pressure PX from 0.7 MPa to 0.6 MPa at time T3. At time T4, squeegee 120 contacts screen 10. At time T5, which completes the control period at which control pressure PX becomes 0.6 MPa, control section 148 detects that the response time has changed from response time RT1 to response time RT2, and determines that squeegee 120 has contacted screen 10. Note that, strictly speaking, between time T3 and time T4, squeegee 120 is not contacting screen 10, and between time T4 and time T5 squeegee 120 contacted screen 10. Thus, response time RT2 measured from time T3 to time T5 is larger compared to response time RT2 measured from time T5 by the amount that includes the period in which squeegee 120 was separated from screen 10. In this case, control section 148, for example, in a case in which the response time decreased from response time RT1 by a predetermined amount, is able to respond by determining that switching to the response time RT2 state occurred (squeegee 120 contacted screen 10).

Next, control section 148 performs control to further decrease control pressure PX in reference to control pressure PX that detected squeegee 120 contacting screen 10, in this case 0.6 MPa, to make the pressing force of squeegee 120 the desired degree. For example, a pressure decreasing width is set in advance in control section 148 that indicates how much further to decrease the pressure from control pressure PX at which contact was detected. In the example of FIG. 7, control section 148 further decreases control pressure PX at which contact was detected (0.6 MPa) by 0.3 MPa. Control section 148 decreases control pressure PX to a pressure decreased by 0.3 MPa with respect to 0.6 MPa (in this case, the result being 0.3 MPa). Control section 148 starts printing work at time T6, which is when control pressure PX becomes 0.3 MPa. Accordingly, printer 100 enables squeegee 120 to press against screen 10 with a desired pressing force, such that suitable printing can be performed.

Also, control section 148, similar to control that decreases control pressure PX, is able to detect separation between squeegee 120 and screen 10 from changes of response times RT1 and RT2 during control to increase the pressure. In the example shown in FIG. 7, at time T7, squeegee 120 separates from screen 10. Control section 148, for example, in a case in which squeegee 120 is separated once from screen 10 to adjust the angle and position of squeegee 120, is able to control with reference to control pressure PX at which the response time changed from response time RT2 to response time RT1.

Also, there are cases in which response times RT1 and RT2 are different when control pressure decreases compared to when control pressure increases. This could be a case in which, for example, when squeegee 120 that has contacted screen 10 is separated from screen 10, solder paste on screen 10 may have become attached to squeegee 120, and by the force due to the viscosity of the solder paste acting (force acting opposite to the separation of squeegee 120 from screen 10), response times RT1 and RT2 are different for contact and separation. Alternatively, for pressing force adjusting air cylinder 56, the friction that arises from the sliding by each other of piston 62 and cylinder housing 64 may be different for when piston 62 is rising to when piston 62 is lowering. In these cases, it is desirable to measure or simulate response times RT1 and RT2 in advance and set different values for when squeegee 120 is lowered and when squeegee 120 is raised. By this, control section 148 is able to detect control pressure PX of when squeegee 120 contacts and separates from screen 10 more accurately by using different optimal response times RT1 and RT2 for when squeegee 120 is raised and when squeegee 120 is lowered.

The following effects are obtained according to the embodiment described in detail above.

Effect 1

Squeegee 120 is lowered towards screen 10 when internal pressure P of second air chamber 74 of pressing force adjusting air cylinder 56 is decreased. Control section 148 performs control of air regulator 96 based on response times RT1 and RT2 from starting control of air regulator 96 to decrease or increase internal pressure P of second air chamber 74 until a value detected by pressure sensor 114 reaches a target value of internal pressure P.

With printer 100 of the present embodiment, response time RT2 after squeegee 120 has contacted screen 10 is faster compared to response time RT1, which is before contact. Therefore, control section 148 calculates a response time while internal pressure P of second air chamber 74 decreases, and when detecting that the response time has changed from response time RT1 to response time RT2, determines that squeegee 120 is in a state contacting screen 10. By performing control with reference to this internal pressure P (control pressure PX of air regulator 96) for which response times RT1 and RT2 are detected, it is possible to adjusting the pressing force of squeegee 120 on screen 10. In general, with this type of printer 100, pressure sensor 114 is provided on not only pressing force adjusting air cylinder 56, but also an air cylinder that changes the position of a movable section. Thus, according to this printer 100, because an existing pressure sensor, pressure sensor 114, is used, it is not necessary to separately provide a dedicated sensor (a load sensor or the like) for detecting the pressing force of squeegee 120.

Also, with conventional technology, when providing a load sensor on squeegee holding member 118 or the like in order to accurately measure the load of squeegee 120, there is a tendency for the configuration of squeegee unit 40 to be complex due to the need to provide the load sensor at an appropriate position. Conversely, with printer 100 of the present embodiment, there is no need to separately provide a load sensor or the like, so the configuration is simple. As described above, according to printer 100 of the present embodiment, the pressing force of squeegee 120 is adjusted accurately with a simple configuration, and manufacturing costs are reduced.

Effect 2

Control section 148 calculates response times RT1 and RT2 required to decrease or increase control pressure PX of air regulator 96 by 0.1 MPa. Also, control section 148 separately detects contact or separation of squeegee 120 and screen 10 based on the changes in the measured response times RT1 and RT2. Further, when control section 148 detects contact of squeegee 120 on screen 10, using control pressure PX at the point of detection as a reference, control section 148 further controls control pressure PX to change the pressing force of squeegee 120 on screen 10 to a desired degree.

Effect 3

With printer 100, air regulator 96 that adjusts the pressure of air supplied from air source 98 is provided between air source 98 and cylinder housing 64. Control section 148 accurately adjusts internal pressure P of second air chamber 74 of cylinder housing 64 by controlling control pressure PX of air regulator 96.

Effect 4

Printer 100 is provided with compression coil spring 86 that biases squeegee 120 in a direction against the biasing force due to pressing force adjusting air cylinder 56 (the downward direction in FIG. 5). According to this configuration, by adjusting the biasing force due to pressing force adjusting air cylinder 56 and the biasing force due to compression coil spring 86, it is possible to change the pressing force of squeegee 120.

Also, the biasing force of compression coil spring 86 acts on squeegee 120 in addition to the total weight of members that move together with squeegee 120 (straight line moving member 104 and the like). Thus, with this configuration, even in a case in which an appropriate pressing force of squeegee is larger than the total weight of the members that move together with squeegee 120, screen 10 is pressed by squeegee 120 with an appropriate pressing force, and an appropriate amount of solder paste is printed onto printed circuit board 20.

Effect 5

Pressing force adjusting air cylinder 56 is not provided with a seal member at a section at which cylinder housing 64 and piston 62 slide by each other. Instead of a seal member, clearance grooves 76 and 78 are formed at the sliding portion of pressing force adjusting air cylinder 56 such that a practically sealed state is maintained. Due to this, variance in resistance due to friction of a seal member that occurs with conventional air cylinders does not occur with pressing force adjusting air cylinder 56. Thus, according to pressing force adjusting air cylinder 56, the accuracy of control of the pressing force of squeegee 120 on screen 10 is improved.

Note that, solder paste printer 100 is an example of a screen printer. Air cylinders 42 and 56 are each an example of a fluid pressure cylinder. Compression coil spring 86 is an example of an elastic member. Air source 98 is an example of a fluid supply section. Response times RT1 and RT2 required to decrease or increase control pressure PX by 0.1 MPa are each an example of a response time. Solder paste is an example of a printing material. Printed circuit board 20 is an example of a target object. Air is an example of a fluid.

Meanwhile, it goes without saying that the present disclosure is not limited to the above-mentioned embodiment and may be improved and modified in various ways without departing from the scope of the disclosure. For example, in the present embodiment, the configuration for controlling internal pressure P of second air chamber 74 is one example; it is possible, for example, to provide an electromagnetic direction switching valve that switches to and from supply and removal of air instead of air regulator 96, and to control the electromagnetic direction switching valve using control section 148. In this case, for example, control section 148 may time switching of the electromagnetic direction switching valve based on the timing of starting measurement of response times RT1 and RT2. Further, instead of being configured to control internal pressure P of second air chamber 74, printer 100 may be configured to control the internal pressure of first air chamber 72. Also, squeegee unit 40 may be configured to lower squeegee 120 by increasing internal pressure P of second air chamber 74.

Also, compression coil spring 86 is not limited to a quantity of one, multiple thereof may be provided. Further, pressing force adjusting air cylinder 56 may be provided with a seal member at a section at which cylinder housing 64 and piston 62 slide by each other.

Also, in the present embodiment, printer 100 performs printing by moving squeegee 120 with respect to a fixed screen 10, but screen 10 may be moved with respect to squeegee 120. Also, printer 100 may perform printing by moving both screen 10 and squeegee 120. Further, the fluid supplied to pressing force adjusting air cylinder 56 is not limited to air, a gas such as nitrogen or a liquid such as oil may be supplied.

Technical ideas arising from the above described contents are given next. A screen printer according to the present disclosure, wherein the control section, by performing control to bring the squeegee towards the screen, and performing control to separate the squeegee from the screen, uses different of the response times.

According to this printer, the control section, by using different optimal response times for a case in which the squeegee approaches the screen and a case in which the squeegee separates from the screen, is able to more accurately detect the internal pressure of when the squeegee contacts the screen and of when the squeegee separates from the screen.

REFERENCE SIGNS LIST

100: printer; 10: screen; 20: printed circuit board; 56: pressing force adjusting air cylinder; 62: piston; 64: cylinder housing; 86: compression coil spring; 96: air regulator; 98: air source; 114: pressure sensor; 120: squeegee; 148: control section; P: internal pressure; RT1, RT2: response time

The invention claimed is:

1. A screen printer comprising:
   a screen including multiple holes;
   a squeegee that slides on the screen so as to print printing material onto a target object through the holes of the screen;
   a fluid pressure cylinder that biases the squeegee in a direction either towards or away from the screen based on internal pressure of a cylinder housing;
   a pressure sensor that detects the internal pressure of the cylinder housing; and
   a control section that controls the internal pressure based on a response time, which is a time from starting control to change the internal pressure by supplying or removing a specified amount of fluid per unit of time with respect to the fluid pressure cylinder to a detection value of the pressure sensor reaching a target value.

2. The screen printer according to claim 1, wherein
   the control section calculates the response time required to change the internal pressure by a predetermined pressure as a predetermined response time, detects the contact or separation of the squeegee with respect to the screen based on the changing of the predetermined response time, and, after detecting that the squeegee has contacted the screen, further controls the internal pressure so as to change the pressing force of the squeegee on the screen.

3. The screen printer according to claim 1, further provided with
   a fluid supply section that supplies a fluid to the fluid pressure cylinder, and
   a regulator, connected between the fluid supply section and the fluid pressure cylinder, that adjusts the pressure of the fluid supplied from the fluid supply section to be a predetermined pressure based on control of the control section.

4. The screen printer according to claim 1, further provided with
   an elastic member that biases the squeegee in a direction against the biasing force due to the fluid pressure cylinder.

5. The screen printer according to claim 1, wherein
   the fluid pressure cylinder is an air cylinder without a seal member provided at a section at which the cylinder housing and a piston slide by each other.

* * * * *